(12) United States Patent
Moriya

(10) Patent No.: US 7,760,034 B2
(45) Date of Patent: Jul. 20, 2010

(54) SURFACE-MOUNT TYPE CRYSTAL OSCILLATOR

(75) Inventor: Kouichi Moriya, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 46 days.

(21) Appl. No.: 12/175,354

(22) Filed: Jul. 17, 2008

(65) Prior Publication Data
US 2009/0021316 A1    Jan. 22, 2009

(30) Foreign Application Priority Data
Jul. 19, 2007    (JP)    ............................. 2007-188562

(51) Int. Cl.
*H03B 1/00*    (2006.01)
(52) U.S. Cl. .................. 331/68; 331/154; 331/158; 331/116 FE; 331/116 M; 331/116 R; 331/108 D; 331/70
(58) Field of Classification Search .............. 331/68, 331/70, 108 D, 116 FE, 116 M, 116 R, 154, 331/158; 310/315, 318, 344
See application file for complete search history.

(56) References Cited

U.S. PATENT DOCUMENTS 5,952,894 A * 9/1999 Fukiharu .................... 331/176
2003/0197569 A1* 10/2003 Mizusawa .................... 331/158
2003/0210102 A1* 11/2003 Harima et al. ............... 331/158
2007/0075796 A1* 4/2007 Mizumura et al. .......... 331/158
2009/0206938 A1* 8/2009 Takeuchi et al. ............... 331/68

FOREIGN PATENT DOCUMENTS

| JP | 9-83248 | 3/1997 |
| JP | 2006-013650 A | 1/2006 |

* cited by examiner

*Primary Examiner*—Arnold Kinkead
*Assistant Examiner*—Richard Tan
(74) *Attorney, Agent, or Firm*—Knobbe Martens Olson & Bear LLP

(57) ABSTRACT

A surface-mount type crystal oscillator has: a container body having a bottom wall and a frame wall having an opening and provided on one principal surface of the bottom wall; a quartz crystal blank hermetically encapsulated in a recess of the container body, which is formed by the opening of the frame wall; and an IC chip on which an oscillating circuit using the crystal blank is integrated. A region which is a region on the one principal surface of the bottom wall and other than formation regions of the frame wall and the recess is made a flat part, and the IC chip is fixed to the one principal surface of the bottom wall by flip-chip bonding, in the flat part. A crystal inspection terminal electrically connected to the crystal blank is provided on a surface of the flat part.

5 Claims, 3 Drawing Sheets

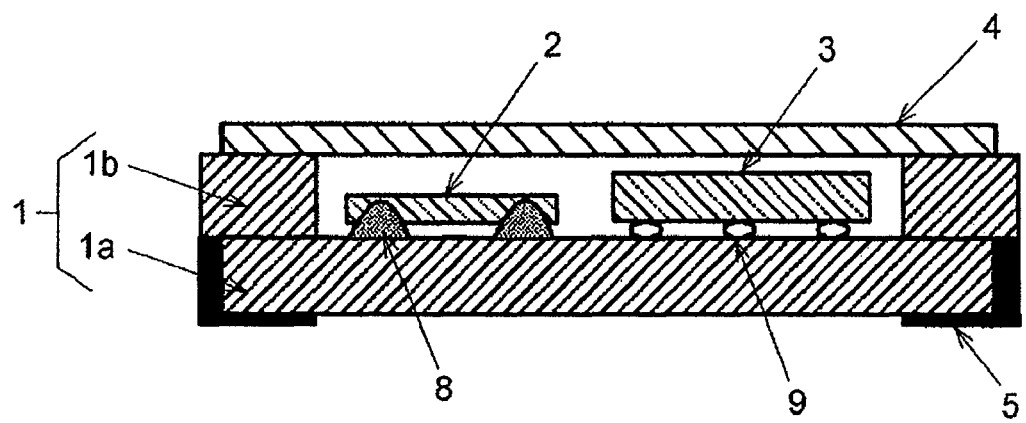
PRIOR ART    FIG. 1A
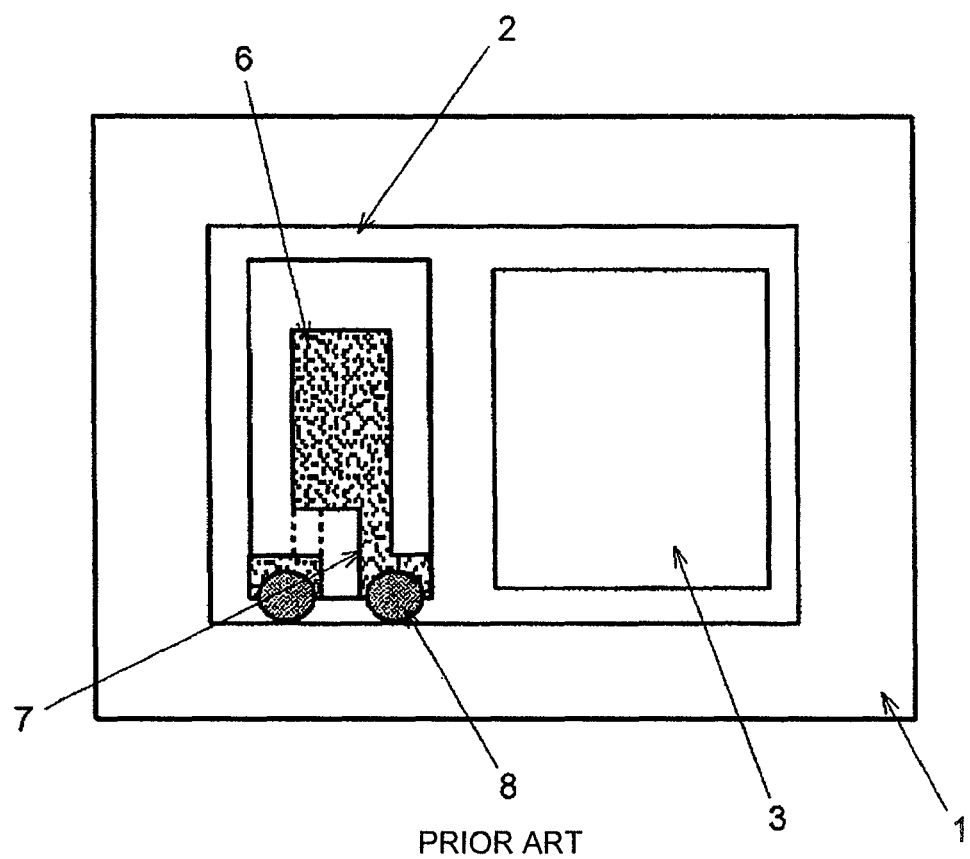
PRIOR ART    FIG. 1B

SURFACE-MOUNT TYPE CRYSTAL OSCILLATOR

BACKGROUND OF THE INVENTION

1. Field of the Invention

The present invention relates to a surface-mount type crystal oscillator, and particularly relates to a surface-mount type crystal oscillator capable of suppressing height from a wiring board to be low when surface-mounted on the wiring board.

2. Description of the Related Arts

Surface-mount type crystal oscillators each configured by integrating a quartz crystal blank and an IC chip which includes an oscillating circuit using the crystal blank are used as reference sources for frequency and time by being incorporated in portable electronic devices typified by, for example, portable telephones because of its compactness and light weight. Depending on the configurations of the devices in which the crystal oscillators are used, the surface-mount type crystal oscillators are sometimes required to be especially small in thickness, that is, height from the surfaces of the wiring boards, when they are surface-mounted on wiring boards of the devices. As the surface-mount type crystal oscillator which can be made small in height when surface-mounted, there is the one in which surface-mount type container with a recess formed on one principal surface is used, and a crystal blank and an IC chip are disposed in the recess side by side in the horizontal direction, as disclosed in Japanese Patent Laid-Open Application No. 9-83248 (JP-A-9-083248) and Japanese Patent Laid-Open Application No. 2006-13650 (JP-A-2006-013650).

FIG. 1A is a sectional view showing one example of a configuration of a conventional surface-mount type crystal oscillator configured to be reduced in height, and FIG. 1B is a plan view of this crystal oscillator with a cover removed.

In the illustrated surface-mount type crystal oscillator, crystal blank 2 and IC chip 3 are housed in a recess of container body 1, and crystal blank 2 and IC chip 3 are hermetically encapsulated in the recess by covering the recess with cover 4. Container body 1 is configured by laminated ceramics in which frame wall 1*b* with a substantially rectangular opening formed in a central portion is laminated on substantially rectangular bottom wall 1*a*. Accordingly, a planar shape of container body 1 is substantially rectangular, the recess is formed by the opening of frame wall 1*b*, and the surface of frame wall 1*b* is exposed on an inner bottom surface of the recess.

A pair of crystal holding terminals for use in electrical connection with crystal blank 2 and a plurality of circuit terminals for use in electrical connection to IC chip 3 are provided on the inner bottom surface of the recess. Mounting terminals 5 which are used when the crystal oscillator is surface-mounted on a wiring board are provided at four corner portions of an outer bottom surface of container body 1.

Crystal blank 2 is, for example, a substantially rectangular quartz crystal blank of AT-cut. Excitation electrodes 6 are respectively provided on both principal surfaces of crystal blank 2, and lead electrodes 7 are respectively extended from excitation electrodes 6 toward both sides of one end portion in the lengthwise direction of crystal blank 2. Crystal blank 2 is electrically and mechanically connected to the crystal holding terminals by fixing both sides of the one end portion where lead electrodes 7 are extended, onto the crystal holding terminals with conductive adhesive 8, and is horizontally held in the recess of container body 1.

IC chip 3 is in a substantially rectangular shape, in which electronic circuits such as an amplifying circuit which configures an oscillating circuit using crystal blank 2 are integrated on a semiconductor substrate. These electronic circuits are formed on one principal surface of the semiconductor substrate by an ordinary semiconductor fabrication process. Thus, out of both the principal surfaces of IC chip 3, the surface on which the electronic circuits are formed in the semiconductor substrate will be called a circuit formation plane. The circuit formation plane is provided with a plurality of IC terminals (not shown) for connecting the electronic circuits in IC chip 3 to external circuits. The IC terminals include, for example, a power supply terminal, a ground terminal, an oscillation output terminal, an AFC (automatic frequency control) terminal, and a pair of connection terminals which are electrically connected to crystal blank 2.

IC chip 3 is disposed on the inner bottom surface of the recess of container body 1 adjacently to and side by side with crystal blank 2 so that the circuit formation plane faces the inner bottom surface of the recess. For example, bumps 9 are provided on the IC terminals, and by the technique of flip-chip bonding through bumps 9, the IC terminals and the circuit terminals on the inner bottom surface of the recess are electrically and mechanically connected. Of the circuit terminals, the ones corresponding to the connection terminals of IC chip 3 are electrically connected to the crystal holding terminals via a wiring pattern (not shown) formed on the inner bottom surface of the recess of container body 1, whereby the oscillating circuit in IC chip 3 is electrically connected to crystal blank 2. Further, of the circuit terminals, the ones corresponding to the power supply terminal, the ground terminal, the oscillation output terminal and the AFC terminal of IC chip 3 are electrically connected to mounting terminals 5 through wiring paths (not shown) such as via holes formed in container body 1.

In the crystal oscillator, crystal blank 2 and IC chip 3 are disposed on the inner bottom surface of the recess of container body 1 side by side in the horizontal direction, and therefore, the dimension in the height direction of the crystal oscillator can be made small as compared with the one in which crystal blank 2 and IC chip 3 are disposed in the vertical direction, that is, the one in which crystal blank 2 is held above IC chip 3.

However, the surface-mount type crystal oscillator of the aforementioned configuration has the problem of being incapable of providing various communication terminals on an outer surface of the container body, though the height dimension can be made small. For example, when the crystal oscillator is configured as a temperature compensated crystal oscillator by providing the circuit of a temperature compensating mechanism, which compensates frequency temperature characteristics of the crystal blank, in IC chip 3, it is necessary to measure the actual frequency temperature characteristics of the crystal blank and write temperature compensation data based on the measurement result to the temperature compensating circuit before shipment of the crystal oscillator. Therefore, a write terminal for writing the temperature compensation data needs to be provided on the outer surface of the container body as a communication terminal. Further, when the vibration characteristic of crystal blank 2 in the state in which crystal blank 2 is hermetically encapsulated in container body 1 and fixed to the crystal holding terminals is desired to be inspected, and in order to conduct such inspection, a crystal inspection terminal electrically connected directly to crystal blank 2 needs to be provided on the outer surface of the container body as a communication terminal. These communication terminals are not used in an ordinary use state of the crystal oscillator after shipment.

It is conceivable to provide a communication terminal on an outer bottom surface of the container body, or provide a communication terminal in a depressed part by forming the depressed part on the outer bottom surface of the container body. However, when the communication terminal is provided like this, if the communication terminal is a crystal inspection terminal, the wiring pattern on the wiring board and the crystal inspection terminal are close to each other and both of them are electrically coupled, and may cause a change in oscillation frequency when the crystal oscillator is mounted on the wiring board.

In the crystal oscillator shown in FIGS. 1A and 1B, crystal blank 2 and IC chip 3 are housed in the same space formed in container body 1 and hermetically encapsulated. Therefore, when an abnormality of the vibration characteristic of the crystal blank is found in inspection after encapsulation, not only the crystal blank but also the IC chip has to be discarded, and productivity of the crystal oscillator is reduced correspondingly. Since IC chip 3 is also housed in the recess of container body 1, there is the problem that IC chip 3 needs to be small by the frame width of frame wall 1b configuring the recess as compared with the outside dimension of container body 1, and IC chip 3 of a large planar dimension cannot be used. Especially when the crystal oscillator is a temperature compensated crystal oscillator, IC chip 3 needs to contain a temperature compensation mechanism, and tends to have a large size as compared with a simple packaged crystal oscillator which is not of a temperature compensated type, and compactness of container body 1 is inhibited correspondingly.

SUMMARY OF THE INVENTION

An object of the present invention is to provide a surface-mount type crystal oscillator which includes a communication terminal prevented from electrical coupling with a wiring pattern on a wiring board when the crystal oscillator is mounted on the wiring board, and which is capable of using a large IC chip and reduced in a height dimension.

The object of the present invention is attained by a surface-mount type crystal oscillator including; a container body having a bottom wall, and a frame wall having an opening and provided on one principal surface of the bottom wall; a crystal blank hermetically encapsulated in a recess of the container body, which is formed by the opening of the frame wall; and an IC chip on which an oscillating circuit using the crystal blank is integrated, wherein a region which is a region on the one principal surface of the bottom wall and other than formation regions of the frame wall and the recess is made a flat part, and the IC chip is fixed to the one principal surface of the bottom wall by flip-chip bonding, in the flat part, and a crystal inspection terminal which is electrically connected to the crystal blank is provided on a surface of the flat part.

With such a configuration, the crystal blank and the IC chip are disposed in the container body side by side in the horizontal direction, and therefore, the height of the crystal oscillator is kept small. Further, the IC chip is disposed outside the recess, and thereby, the operation of flip-chip bonding can be easily performed. The size of the IC chip is not limited by the frame wall, and therefore, even an IC chip with a relatively large planar outer shape size which is used in a temperature compensated crystal oscillator can be mounted on the container body. The crystal inspection terminal is provided on the flat part, and therefore, when the crystal oscillator is surface-mounted on the wiring board, occurrence of electrical coupling between the wiring pattern of the wiring board and the crystal inspection terminal can be suppressed.

In the present invention, a protection resin is preferably injected between a circuit formation plane of the IC chip and the one principal surface of the bottom wall. At this time, a jetty, which is lower in height than a diameter of a bump for use in the flip-chip bonding and is narrower in width than frame width of the frame wall, may be provided along an outer perimeter of the flat part, and the protection resin may be injected into the flat part in a region surrounded by the jetty. By providing the jetty, the protection resin can be prevented from flowing out from the perimeter of the flat part at the time of injection of the liquid protection resin without using a special jig or the like. The jetty, which is constituted of, for example, alumina or the like and can be provided by a printing method, can be formed by fine width, and therefore, the planar dimension of the IC chip which is mounted can be made large. Further, the height of the jetty is lower than the diameter of the bump, and therefore, the operation of flip-chip bonding can be easily performed

BRIEF DESCRIPTION OF THE DRAWINGS

FIG. 1A is a sectional view showing one example of a configuration of a conventional surface-mount type crystal oscillator;

FIG. 1B is a plan view of the crystal oscillator shown in FIG. 1A with a cover removed;

DETAILED DESCRIPTION OF THE INVENTION

Figure 2A:
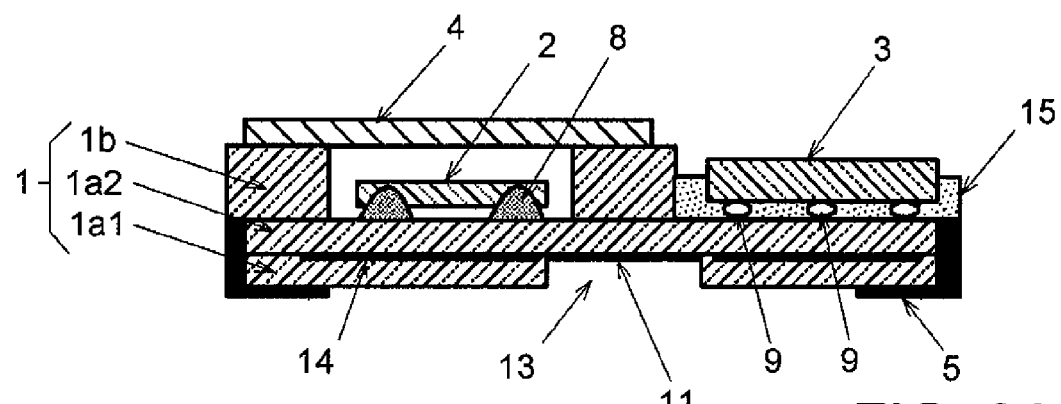
FIG. 2A is a sectional view showing a configuration of a surface-mount type crystal oscillator according to a first embodiment of the present invention.
Figure 2B:
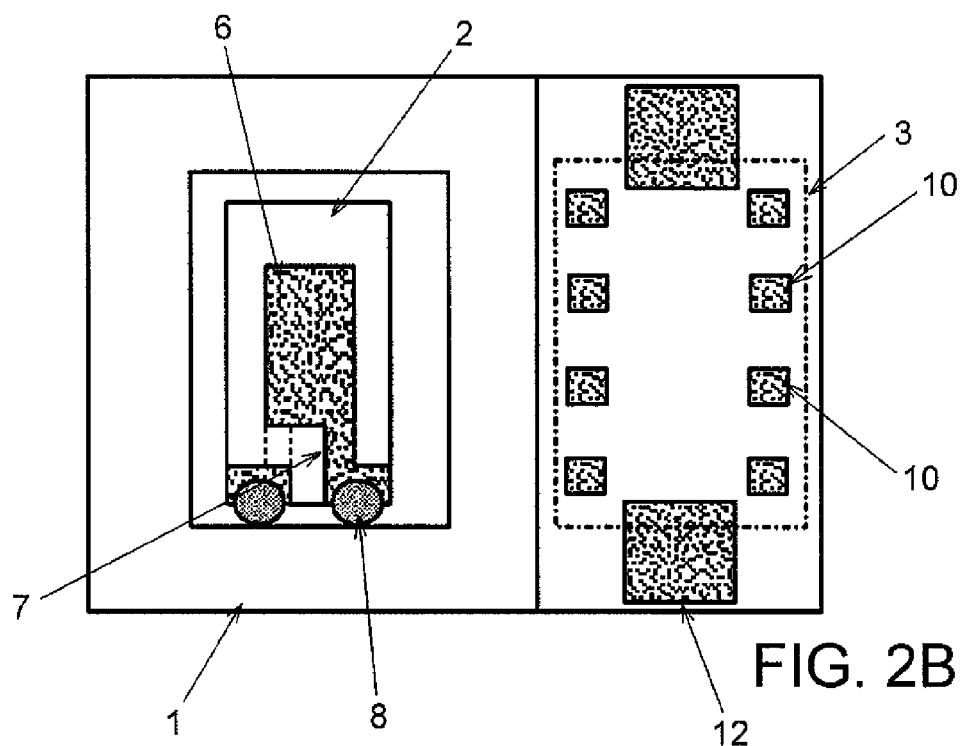
FIG. 2B is a plan view of the crystal oscillator shown in FIG. 2A with a cover and an IC chip removed.
Figure 2C:
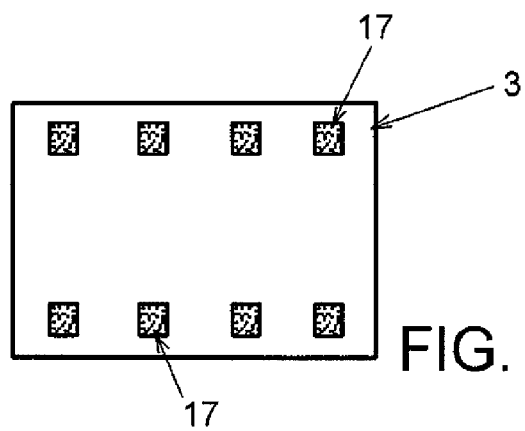
FIG. 2C is a plan view showing a circuit formation plane of the IC chip.

In FIGS. 2A to 2C showing a surface-mount type crystal oscillator according to a first embodiment of the present invention, the same components in FIGS. 1A and 1B are assigned with the same reference numerals, and the redundant description is not repeated.

In the crystal oscillator of the first embodiment, quartz crystal blank 2 and IC chip 3 are disposed on one principal surface of container body 1 side by side in the horizontal direction Container body 1 is configured by laminated ceramics constituted of planar bottom wall 1a and frame-shaped frame wall 1b provided on bottom wall 1a as in the above described one. Bottom wall 1a has a laminated structure of lower layer 1a1 at the lower side and upper layer 1a2 at the upper side as illustrated in FIG. 2A. In the present embodiment, the outer perimeter dimension of frame wall 1b is set at about a half of the outer perimeter dimension of bottom wall 1a, and frame wall 1b is provided in, for example, only in a region of a left half of bottom wall 1a as illustrated in FIGS. 2A and 2B. Specifically, the recess of container body 1 is formed in the region of the left half in the drawings in container body 1. Frame wall 1b is not provided in a region of a right half of bottom wall 1a in the drawings, and the region is a flat part where a top surface of bottom wall 1a is exposed. The flat part is not surrounded by frame wall 1b, and is opened in the three directions in the horizontal plane.

A pair of crystal holding terminals are provided on an inner bottom surface of a recess by frame wall 1b. Crystal blank 2 is held horizontally in the recess by fixing both sides at one end portion, where lead electrodes 7 are extended, onto the crystal holding terminals by conductive adhesive 8. As crystal blank 2, the same crystal blank as shown in FIGS. 1A and 1B is used.

On the surface of the flat part of container body 1, eight circuit terminals 10 in total are provided at two columns on left and right with the four circuit terminals at each column, as illustrated in FIG. 2B.

IC chip 3 is in a substantially rectangular shape, in which electronic circuits such as an amplifying circuit configuring an oscillating circuit using crystal blank 2 are integrated on a semiconductor substrate. As shown in FIG. 2C, on a circuit formation plane of IC chip 3, for example, eight IC terminals 17 are provided to correspond to circuit terminals 10 provided on container body 1. IC terminals 17 include, for example, a power supply terminal, a ground terminal, an oscillation output terminal, an AFC terminal, and a pair of connection terminals electrically connected to crystal blank 2. When a temperature compensating mechanism is integrated on IC chip 3, the IC terminals 17 also include a terminal for writing temperature compensation data to the temperature compensating mechanism. IC chip 3 is fixed to the surface of the flat part by the technique of flip-chip bonding. More specifically, the IC terminals 17 of IC chip 3 are joined to circuit terminals 10 by ultrasonic thermocompression bonding using bumps 9 constituted of gold (Au) or the like, and IC chip 3 is electrically and mechanically connected to circuit terminals 10.

A pair of crystal holding terminals provided on the bottom surface of the recess are electrically connected to circuit terminals 10 corresponding to the connection terminals at the IC chip through conductive paths formed in the lamination plane between bottom wall 1*a* and frame wall 1*b*. Of the circuit terminals other than them, the circuit terminals corresponding to the power supply terminal, the output terminal, the ground terminal and the AFC terminal at IC chip. 3 are electrically connected to mounting terminals 5 provided at four corner portions of an outer bottom surface of container body 1 through conductive paths formed in the lamination plane between bottom wall 1*a* and frame wall 1*b* and a through-hole machined surface provided in an end surface of bottom wall la.

When the surface-mount type crystal oscillator of the present embodiment is configured as a temperature compensated crystal oscillator, a temperature compensating mechanism is also integrated on IC chip 3. Container body 1 is also provided with write terminal 11 for writing temperature compensation data to the temperature compensating mechanism, in addition to mounting terminals 5. For example, two write terminals 11 are provided. In the illustrated one, a depressed part is formed in bottom wall 1*a* at a position which is in a central region of the outer bottom surface of container body 1 and in which frame wall 1*b* is formed, and write terminal 11 is formed in the depressed part. More specifically, opening 13 is provided in lower layer 1*a*1 out of two layers 1*a*1 and 1*a*2 configuring bottom wall 1*a*, whereby the depressed part is formed at the position, and upper layer 1*a*2 is exposed on a bottom surface of the depressed part. Write terminal 11 is formed on an exposed surface of upper layer 1*a*2. Write terminal 11 is electrically connected to IC terminal 17 for writing temperature compensation data through a conductive path (not shown) formed in container body 1. Further, in this example, at the position other than a formation region of write terminal 17, shield electrode layer 14 is formed on the lamination plane between upper layer 1*a*2 and lower layer 1*a*1. Shield electrode layer 14 is electrically connected to mounting terminals 5 for grounding.

In the surface-mount type crystal oscillator, a pair of crystal inspection terminals 12 are formed on bottom wall 1*a* in the flat part of the one principal surface of container body 1 so that the vibration characteristic of crystal blank 2 as the quartz crystal element can be independently measured after crystal blank 2 is held in the recess and hermetically encapsulated in the recess by joining cover 4 in the manufacturing process of the crystal oscillator. Crystal inspection terminals 12 are electrically connected to the crystal holding terminals in the recess through conductive paths (not shown), and are electrically connected to circuit terminals 10 corresponding to the connection terminals on the IC chip. As the region where IC chip 3 should be disposed in the flat part is shown by the frame of a dotted chain line in FIG. 2B. Crystal inspection terminals 12 are provided to extend significantly outward from the disposition region of IC chip 3 to be in contact with the respective long sides of the outer perimeter of bottom wall 1*a* so as to be accessible even after IC chip. 3 is attached. Here, the size of crystal inspection terminal 12 is set at such a size as to allow a probe for inspection to abut on crystal inspection terminal 12 even when IC chip 3 is attached.

In this crystal oscillator, after IC chip 3 is mounted on the flat part by flip-chip bonding, and the vibration characteristic of crystal blank 2 is inspected by using crystal inspection terminals 12 in accordance with necessity, a layer of protection resin 15 is provided as so-called underfill to protect the circuit formation plane of IC chip 3. Protection resin 15 is injected into a space between the circuit formation plane and bottom wall 1*a* from a nozzle in the state using a jig or a tool to be a flow stopper for protection resin 15. Specifically, the jig or the tool is caused to abut on the outer perimeter of the flat part so as not to allow protection resin 15 to flow outside from the outer perimeter of the flat part, and in this state, liquid protection resin 15 is discharged from the nozzle. Thereafter, protection resin 15 is hardened, and thereby, the layer of protection resin 15 is formed. It should be noted that in the crystal oscillator shown in FIG. 2A, protection resin 15 is provided on an entire surface of the flat part including the top of crystal inspection terminals 12.

In the surface-mount type crystal oscillator of the first embodiment, crystal blank 2 and IC chip 3 are disposed side by side in the horizontal direction in container body 1, and therefore, the height of the crystal oscillator can be suppressed to be small as compared with the case in which both of them are disposed in the vertical direction. Further, only crystal blank 2 is encapsulated in the recess, and thereafter, IC chip 3 can be fixed onto the flat part. Therefore, the vibration characteristic of crystal blank 2 is measured by using crystal inspection terminals 12 at the stage in which crystal blank 2 is encapsulated in the recess, and it can be determined whether crystal blank 2 is good or not as the crystal element. As a result, the crystal blank which is determined as a defective can be discarded before IC chip 3 is attached, and therefore, productivity can be enhanced.

In the surface-mount type crystal oscillator of the first embodiment, write terminals 11 for temperature compensation data are formed in the depressed part of the outer bottom surface of mounting container 1, and crystal inspection terminals 12 are formed on the surface of the flat part. Therefore, the vibration characteristic of crystal blank 2 as a crystal element can be independently inspected after it is configured as the temperature compensated crystal oscillator. Crystal inspection terminals 12 are provided on the flat part, and are located at a side opposite to a wiring board with bottom wall 1*a* therebetween when the crystal oscillator is mounted on the wiring board Therefore, occurrence of electrical coupling and stray capacitance between crystal inspection terminals 12 and a wiring pattern on the wiring board can be suppressed. Accordingly, a change in oscillation frequency after the crystal oscillator is mounted on the wiring board can be prevented.

The depressed part in which write terminal 11 is formed is provided at a position under frame wall 1b via bottom wall 1a, and therefore, even if the thickness of bottom wall 1a is small in the position of the depressed part, reduction in mechanical strength as a result of providing the depressed part can be prevented by the existence of frame wall 1b. Further, in bottom wall 1a, shield electrode layer 14 is formed in the lamination plane of lower layer 1a1 and upper layer 1a2, and therefore, crystal blank 2 and IC chip 3 including crystal inspection terminals 12 can be reliably prevented from being electrically coupled to the circuit pattern on the wiring board. When the crystal inspection terminals are formed on the outer bottom surface of container body 1, the shield electrode layer cannot be provided at the positions of the crystal inspection terminals.

Crystal inspection terminal 12 is formed in such a position and a size as to allow a probe to abut on crystal inspection terminal 12 even when IC chip 3 is mounted. Therefore, even if a malfunction such as poor oscillation occurs after shipment of the crystal oscillator, for example, the vibration characteristic of crystal blank 2 as a crystal element can be independently inspected by removing protection resin 15 on crystal inspection terminals 12 and causing a probe to abut on crystal inspection terminals 12. Accordingly, analysis of the cause of the malfunction or the like can be easily performed. Alternatively, the formation positions of crystal inspection terminals 12 may be located within the disposition region of IC chip 3, and IC chip 3 may be made larger correspondingly.

In the crystal oscillator of the present embodiment, IC chip 3 is not housed in the recess, and IC chip 3 is not surrounded by the side walls of the recess. Therefore, an operation of flip-chip bonding for IC chip 3 by ultrasonic thermocompression bonding can be easily performed.

Figure 3:
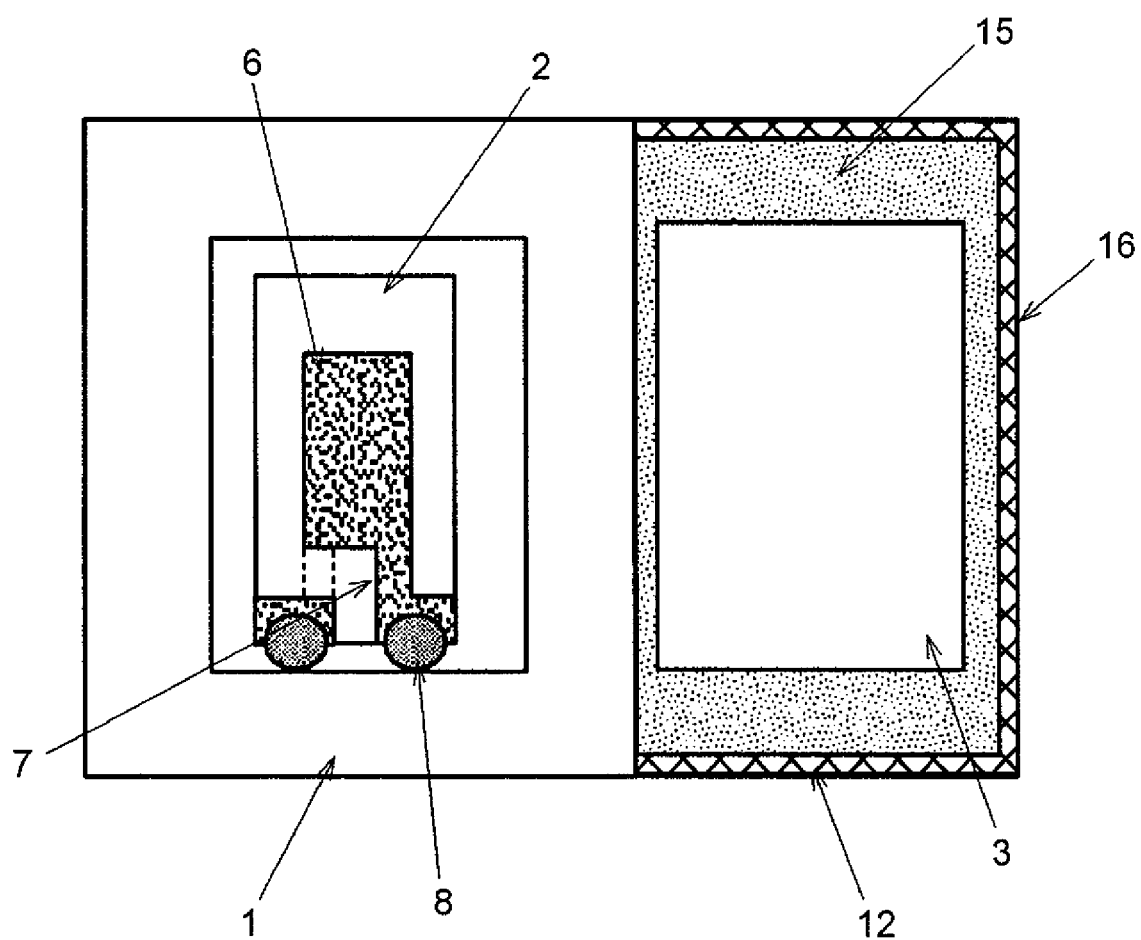
FIG. 3 is a view showing a configuration of a surface-mount type crystal oscillator according to a second embodiment of the present invention, and is a plan view of the crystal oscillator with a cover removed.

Next, a surface-mount type crystal oscillator according to a second embodiment of the present invention will be described. In FIG. 3 showing the crystal oscillator of the second embodiment, the same components as those in FIGS. 2A to 2C are assigned with the same reference numerals, and the redundant description is not repeated.

In the first embodiment, protection resin 15 is applied as underfill by discharging protection resin 15 from a nozzle in the state using a jig or a tool to be the flow stopper for protection resin 15, whereas in the second embodiment, in order to make the jig or the tool to be the flow stopper unnecessary at the time of applying protection resin 15, jetty 16 or ridge is provided along the outer perimeter of the flat part of bottom wall 1a. Jetty 16 is mainly constituted of alumina which is the same as the laminated ceramics configuring container body 1. However, jetty 16 is not formed by lamination of ceramic green sheets, but provided by a printing method, and is formed by being fired integrally with container body 1. The width of jetty 16 is narrower than the width of frame wall 1b, and the height of it is lower than the height of bump 9 after fixing IC chip 3. In this regard, the height of bump 9 is generally 30 μm to 40 μm, and therefore, the height of jetty 16 is set at about 10 μm to 20 μm.

According to the second embodiment, even when a liquid resin to be protection resin 15 is injected from a nozzle (not shown) without using a special jig or tool for preventing outflow, the liquid resin is prevented from flowing out from the outer perimeter of the flat part by jetty 16. At this time, since jetty 16 can be formed by printing, its height can be made small and its width can be made narrow. Therefore, IC chip 3 having a large planar dimension can be mounted on container body 1. Further, the height of jetty 16 is smaller than the size of bump 9, and therefore, even when jetty 16 is provided, the operation of ultrasonic thermocompression bonding of IC chip 3 can be easily performed. According to the second embodiment, productivity is further enhanced as the jig or the tool for stopping flow does not have to be used.

What is claimed is:

1. A surface-mount type crystal oscillator, comprising:
a container body having a bottom wall, and a frame wall having an opening and provided on one principal surface of said bottom wall;
a crystal blank hermetically encapsulated in a recess of said container body, which is formed by said opening of said frame wall; and
an IC chip on which an oscillating circuit using said crystal blank is integrated,
wherein a region which is a region on the one principal surface of said bottom wall and other than formation regions of said frame wall and said recess is made a flat part, and said IC chip is fixed to the one principal surface of said bottom wall by flip-chip bonding, in said flat part,
a crystal inspection terminal which is electrically connected to said crystal blank is provided on a surface of said flat part,
a protection resin is injected between a circuit formation plane of said IC chip and said one principal surface, and
a jetty, which is smaller in height than a diameter of a bump for use in said flip-chip bonding and is narrower in width than frame width of said frame wall, is provided along an outer perimeter of said flat part, and said protection resin is injected into said flat part in a region surrounded by said jetty.

2. The crystal oscillator according to claim 1, wherein said container body is configured by laminated ceramics.

3. The crystal oscillator according to claim 1, wherein said crystal inspection terminal is provided to extend outside a disposition region of said IC chip.

4. The crystal oscillator according to claim 1, wherein a depressed part is formed on the other principal surface of said bottom wall, and a write terminal for writing temperature compensation data in said IC chip is provided in said depressed part.

5. The crystal oscillator according to claim 4, wherein said depressed part is formed on the other principal surface of said frame wall to correspond to the formation region of said frame wall.

* * * * *